(12) United States Patent
Sundaram et al.

(10) Patent No.: US 10,042,355 B2
(45) Date of Patent: Aug. 7, 2018

(54) FLEXIBLE TIME MODELING OF A FACILITY

(71) Applicants: Anantha Sundaram, Annandale, NJ (US); Philip H. Warrick, Oakton, VA (US); Jayanth Balasubramanian, Fairfax, VA (US); Ahmet B. Keha, Fairfax, VA (US); Gary R. Kocis, Vienna, VA (US); Joseph W. Evans, McLean, VA (US)

(72) Inventors: Anantha Sundaram, Annandale, NJ (US); Philip H. Warrick, Oakton, VA (US); Jayanth Balasubramanian, Fairfax, VA (US); Ahmet B. Keha, Fairfax, VA (US); Gary R. Kocis, Vienna, VA (US); Joseph W. Evans, McLean, VA (US)

(73) Assignee: EXXONMOBIL RESEARCH AND ENGINEERING COMPANY, Annadale, NJ (US)

( * ) Notice: Subject to any disclaimer, the term of this patent is extended or adjusted under 35 U.S.C. 154(b) by 348 days.

(21) Appl. No.: 14/589,041

(22) Filed: Jan. 5, 2015

(65) Prior Publication Data
US 2015/0220082 A1 Aug. 6, 2015

Related U.S. Application Data

(60) Provisional application No. 61/935,733, filed on Feb. 4, 2014.

(51) Int. Cl.
*G06F 19/00* (2011.01)
*G05B 19/418* (2006.01)
(Continued)

(52) U.S. Cl.
CPC ... *G05B 19/41865* (2013.01); *G06F 17/5009* (2013.01); *G06Q 10/06* (2013.01);
(Continued)

(58) Field of Classification Search
None
See application file for complete search history.

(56) References Cited

U.S. PATENT DOCUMENTS 8,479,258 B2  7/2013  Weik, III et al.
8,831,970 B2  9/2014  Weik, III et al.
(Continued)

FOREIGN PATENT DOCUMENTS

WO  2013188481 A1  8/2013

OTHER PUBLICATIONS

Smith, Knowledge-Based Production Management: Approaches, Results and Prospects, Carnegie Mellon University, 1992, 43 pages.*

(Continued)

*Primary Examiner* — Diem Cao
(74) *Attorney, Agent, or Firm* — Glenn T. Barrett; Andrew T. Ward

(57) ABSTRACT

A decision support tool to assist decision-making in the operation of a facility. The decision support tool allows a user to perform planning and scheduling of the events within a facility so that established economic goals do not collide with feasibility of a schedule. This is achieved by flexible time modeling, which introduces a "look-ahead" planning and scheduling technique. This technique analyzes several time periods of the schedule in light of upcoming dominant events, in order for each segment of the schedule to remain as consistent with the planning objectives as possible.

17 Claims, 5 Drawing Sheets

(51) Int. Cl.
*G06F 17/50* (2006.01)
*G06Q 10/06* (2012.01)
(52) U.S. Cl.
CPC .......... *G06Q 10/0637* (2013.01); *Y02P 90/20* (2015.11); *Y02P 90/26* (2015.11)

(56) References Cited

U.S. PATENT DOCUMENTS

| | | | |
|---|---|---|---|
| 8,898,619 B2 | 11/2014 | Chaar et al. | |
| 9,349,107 B2 | 5/2016 | Wewalaarachchi et al. | |
| 2007/0250292 A1 | 10/2007 | Alagappan et al. | |
| 2007/0255441 A1* | 11/2007 | Antanies | G05B 23/0232 700/108 |
| 2011/0087381 A1* | 4/2011 | Hirato | G05B 13/024 700/291 |
| 2011/0113120 A1* | 5/2011 | Johnson | G05B 15/02 709/218 |
| 2011/0276165 A1* | 11/2011 | Ko | G05B 23/0245 700/104 |
| 2012/0083927 A1* | 4/2012 | Nakamura | G05B 13/026 700/278 |
| 2012/0191439 A1* | 7/2012 | Meagher | G06Q 50/00 703/18 |
| 2013/0339100 A1 | 12/2013 | Warrick et al. | |
| 2014/0058534 A1* | 2/2014 | Tiwari | G05B 13/04 700/9 |
| 2014/0278692 A1* | 9/2014 | Marwah | G06Q 10/06312 705/7.22 |
| 2014/0303798 A1* | 10/2014 | Saliba | G06Q 10/00 700/291 |
| 2015/0279176 A1 | 10/2015 | Hyde et al. | |

OTHER PUBLICATIONS

PCT Application No. PCT/US2015/010130, Communication from the International Searching Authority, Form PCT/ISA/220, dated Mar. 17, 2015, 8 pages.

PCT Application No. PCT/US2015/010134, Communication from the International Searching Authority received in co-pending, co-owned related patent application (U.S. Appl. No. 14/589,389), Form PCT/ISA/220, dated Mar. 12, 2015, 9 pages.

J.P. Garcia-Sabater, J. Maheut and J.J. Garcia-Sabater, "A Decision Support System for Aggregate Production Planning Based on MILP: A Case Study from the Automotive Industry", Computers & Industrial Engineering, 2009, International Conference, Piscataway, NJ, Jul. 6, 2009, pp. 366-371.

* cited by examiner

AGGREGATION

DISAGGREGATION

FLEXIBLE TIME MODELING OF A FACILITY

CROSS-REFERENCE TO RELATED APPLICATIONS

This application claims priority to U.S. Provisional Application Ser. No. 61/935,733 filed Feb. 4, 2014, herein incorporated by reference in its entirety.

TECHNICAL FIELD

The presently disclosed subject matter relates to decision support tools for the operation of a facility, such as planning and scheduling of operational events of the facility. In particular, the presently disclosed subject matter describes flexible time modeling of the operations in and around a facility, where the scheduling events are coordinated ahead of time in order for them to remain in line with the planning horizon.

BACKGROUND

Conventional decision support tools for operational problems in the oil and gas industry separate planning and scheduling of activities within a facility into two distinct processes that take place in two different contexts. However, these two types of tasks are inherently interdependent, because the plan provides guidance for the implementation of the schedule and the schedule must represent real-world events while observing the business goals set out during the planning process.

Forming and executing a schedule is typically defined by operational events within a site, or by external factors that affect the operations within the site. In the context of time, scheduling decisions are based on moments when the events occur, more often than on preset time periods, such as days, weeks or months. Moreover, schedulers make decisions according to "aggregate" expectations during these events. In other words, certain events in the schedule are formulated in anticipation of future events that they affect or that they are influenced by. This interaction between elements of the schedule needs to be coordinated in the context of real-world feasibility as well as in view of economic metrics.

Planning, on the other hand, normally takes place in an entirely different framework of analysis than scheduling. Namely, planning is conducted in a single-period model, where given raw-material and product prices, crude receipts, refinery models and constraints determine average monthly quantities of products and intermediates and average operating modes and conditions. In other words, in contrast with the scheduling which focuses on achievability of tangible events, the planning tasks concentrate on the economic optimality, where time averaged profitability, for example, is set as a goal for each unit of time within the entire planning time period.

However, while the planning tasks join uniform segments of time containing the averaged data into a single-period model, the segments of time within the schedule, on the other hand, are generally event-based. Accordingly, the schedule is managed by a multi-period model, where, for example, inventories, product liftings or operating modes change weekly or daily. Moreover, the events of one time period of the schedule affect the subsequent ones, thereby further diminishing their mutual uniformity.

These divergent characteristics of the single-period model of the planning and the multiple-period model of the scheduling create difficulties in aligning a feasible schedule with the planning related expectations.

In light of the discussed problems of the existing technology, there is a need for a tool that is capable of bringing the planning and scheduling models closer together. Specifically, there is need for a technique that would set one of the two time models as a reference and derive the other one accordingly by providing a degree of flexibility to the derived one so that it can be adjusted based on the referenced one.

SUMMARY

The presently disclosed subject matter relates to a planning and scheduling tool that provides a user with the ability to perform flexible time modeling of operational events within a facility so that economic goals do not collide with feasibility of the schedule. This may be achieved by a "look-ahead" scheduling technique, which may analyze several time periods of the schedule in anticipation of upcoming dominant events, in order for each segment of the schedule to remain practicable and as consistent with the planning objectives as possible.

The presently disclosed subject matter provides a method of planning, scheduling and operating a facility. The method comprises: (a) using a computer system that stores an application for determining a plan and a schedule for the operation of a facility; (b) acquiring data from operational activities of the facility; (c) aggregating the acquired data and defining a mathematical model for the aggregated data to be processed; (d) solving the mathematical model and obtaining results, wherein the obtained results determine the plan for the operation of the facility; (e) extracting operational data and combining the operational data with the results obtained by the mathematical model in order to apply flexible time modeling, wherein the flexible time modeling includes: (1) defining a set of targets achievable by the schedule, and (2) analyzing a portion of the schedule covering a plurality of upcoming operational events of the facility in order for the analyzed portion of the schedule as a whole to remain consistent with the results obtained by the mathematical model and with the defined set of achievable targets; (f) disaggregating data that pertains to the analyzed portion of the schedule and determining the schedule according to the disaggregated data; and (g) applying the application to operate the facility according to the determined plan and the determined schedule.

The mathematical model may be solved as a multi-period model that may process data of a plurality of time periods. Further, the portion of the schedule may include an entire operational time period analyzed by the plan. The flexible time modeling may be reapplied upon occurrence of a subsequent operational event that is not accounted for in the mathematical model, and that occurs prior to implementation of the schedule. The mathematical model may include a strategy-based optimization. Data aggregation may be performed by an average aggregation technique, a snapshot aggregation technique or a customized aggregation technique. Similarly, data disaggregation may be performed by an average disaggregation technique, a snapshot disaggregation technique or a customized disaggregation technique.

The presently disclosed subject matter provides a computer system for planning, scheduling and determining the operation of a facility, the computer system being programmed to perform steps that comprise: a) using a computer system that stores an application for determining a plan and a schedule for the operation of a facility; (b)

acquiring data from operational activities of the facility; (c) aggregating the acquired data and defining a mathematical model for the aggregated data to be processed; (d) solving the mathematical model and obtaining results, wherein the obtained results determine the plan for the operation of the facility; (e) extracting operational data and combining the operational data with the results obtained by the mathematical model in order to apply flexible time modeling, wherein the flexible time modeling includes: (1) defining a set of targets achievable by the schedule, and (2) analyzing a portion of the schedule covering a plurality of upcoming operational events of the facility in order for the analyzed portion of the schedule as a whole to remain consistent with the results obtained by the mathematical model and with the defined set of achievable targets; (f) disaggregating data that pertains to the analyzed portion of the schedule and determining the schedule according to the disaggregated data; and (g) applying the application to operate the facility according to the determined plan and the determined schedule. In another embodiment, the present invention provides a non-transitory machine-readable storage medium comprising instructions which, when executed by a processor, cause the processor to perform these steps.

In both the computer system and the non-transitory machine-readable storage medium the mathematical model may be solved as a multi-period model that processes data of a plurality of time periods. Further, the portion of the schedule may include an entire operational time period analyzed by the plan. The flexible time modeling may be reapplied upon occurrence of a subsequent operational event that is not accounted for in the mathematical model, and that occurs prior to implementation of the schedule. The mathematical model may include a strategy-based optimization. Data aggregation may be performed by an average aggregation technique, a snapshot aggregation technique or a customized aggregation technique. Similarly, data disaggregation may be performed by an average disaggregation technique, a snapshot disaggregation technique or a customized disaggregation technique.

DETAILED DESCRIPTION

The presently disclosed subject matter provides a tool for the operation of a facility(s). The tool is preferably a decision support tool, but is not intended to be so limited; rather, it is contemplated that other tools or means that enable planning and scheduling are within the scope of the presently disclosed subject matter. The presently disclosed subject matter will be described in connection with one or more petrochemical facilities for purpose of illustration. It is intended that the presently disclosed subject matter may be used at any site where planning and scheduling are a normal part of operating the site. The operation of a petrochemical facility may involve various decisions, including the process operations, blending operations, transportation of materials (e.g. feeds, intermediates, or products) to and/or from the facility (e.g. via maritime shipping, rail, truck, pipeline, etc.), cargo assignments, vessel assignments, evaluation and selection of raw or feed materials, and the timing of these activities. Examples of petrochemical facilities include, but are not limited to, refineries, storage tank farms, chemical plants, lube oil blending plants, pipelines, distribution facilities, LNG facilities, basestock production facilities, and crude, feedstock and product blending facilities. The presently disclosed subject matter may also be used in connection with facilities that produce and transport crude oil and/or refined intermediate and/or finished products including but not limited to chemicals, base stocks, and fractions. It is also contemplated that the presently disclosed subject matter may be used in other operations and facilities that are not associated with petroleum and petrochemical processing, but where planning and scheduling issues are present.

Figure 1:
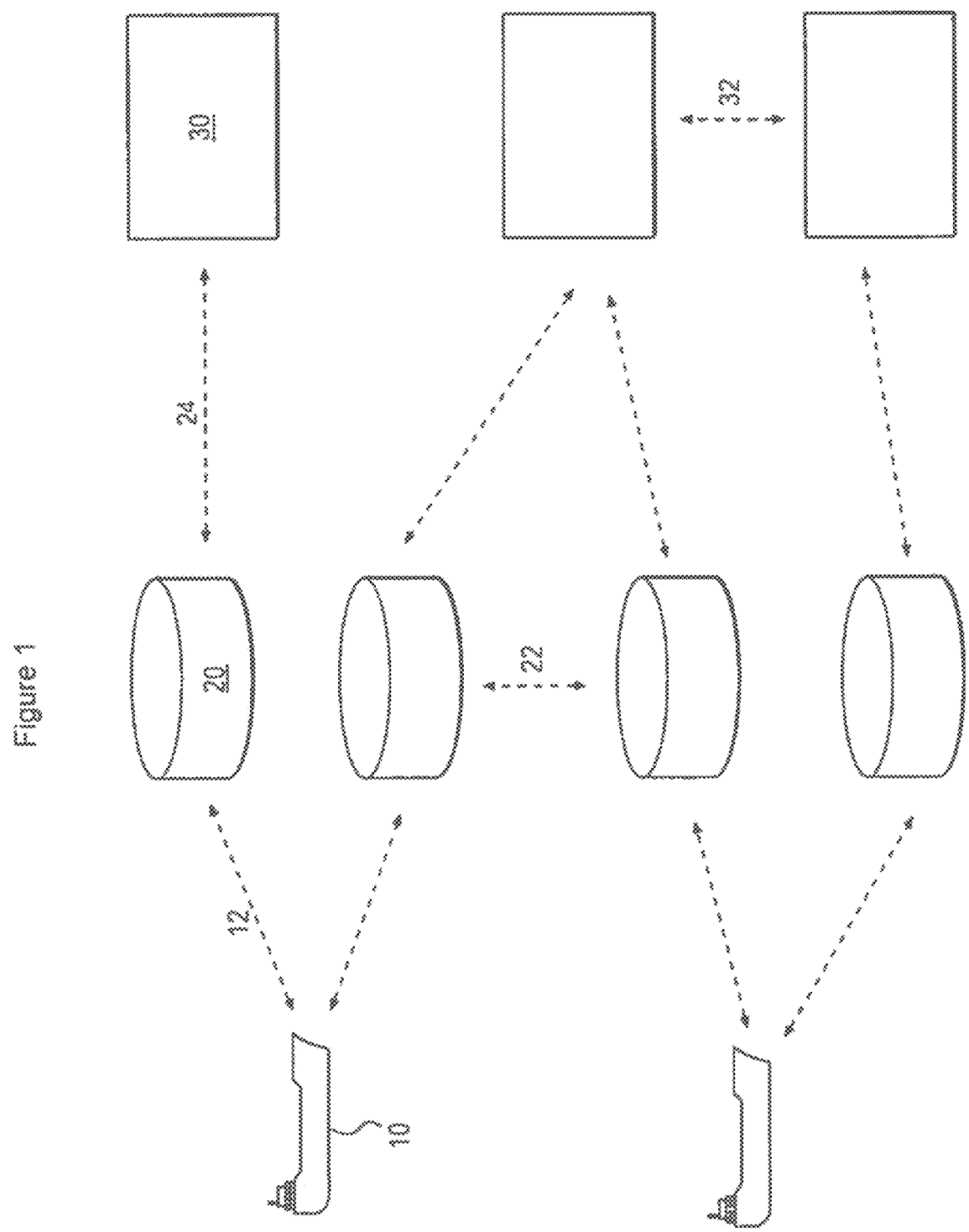
FIG. 1 shows an example of a refinery to which the tool of the present invention can be applied.

FIG. 1 shows an example of a refinery or petrochemical facility that can be operated utilizing the presently disclosed subject matter. The refinery includes storage tanks 20 and processing equipment 30 (e.g. crude distillation units, steam and catalytic cracking units, hydroprocessing units, blenders, reactors, separation units, mixers, chemical processing units, utilities (including the supply of hydrogen and other feeds necessary for the production of refined products) etc.). Operations in the refinery include the transfer 12 (discharging and/or loading) of materials between the ships 10 and storage tanks 20. There may also be transfers 22 of material between tanks 20. There may also be transfer 24 of materials between storage tanks 20 and processing equipment 30. There may also be transfer 32 of materials between processing equipment 30. Processing equipment 30 may transform a feed material or raw material into a different material. The operation of the refinery can include numerous other activities, such as selection of raw materials, etc. The tool in accordance with the presently disclosed subject matter may be utilized to plan and schedule for the operation of the facility.

Figure 2:
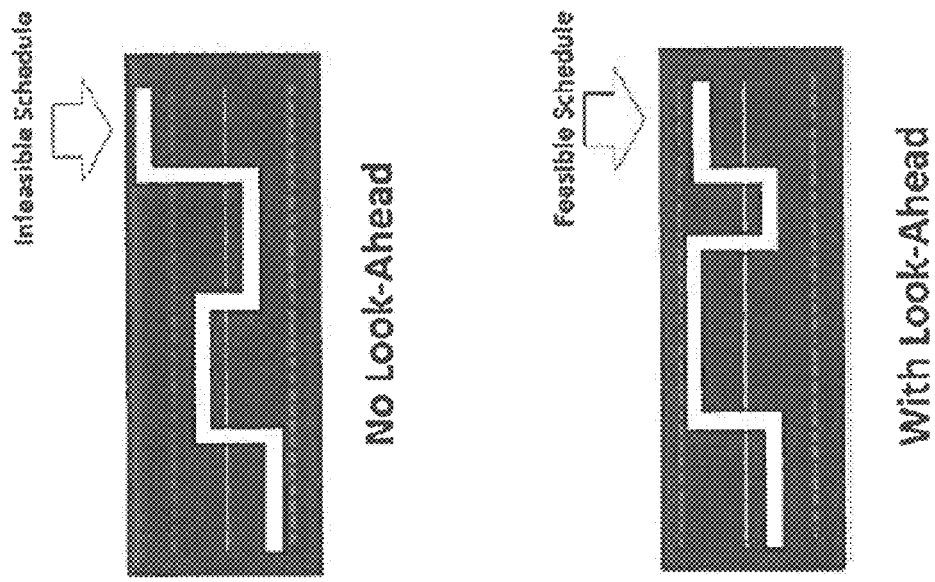
FIG. 2 shows a comparison between a conventional planning and scheduling technique and the "look-ahead" planning and scheduling approach of the present invention.

FIG. 2 compares a lack of coordination between conventional planning and scheduling tasks on one hand, and an improved correlation technique of one example of the present disclosure, on the other hand. The top image of FIG. 2 represents a relation between the planning and the scheduling processes of the conventional technology. The bottom drawing is an example of flexible time modeling which results in better alignment of the schedule with the planning goals. In both drawings dashed lines indicate feasible inventory constraints, i.e. an upper and a lower limit of the inventory level of a product at hand. Moreover, in both images a thin solid line represents a planned inventory level of the product. The plan may be managed by a single-period model, where data may be assembled for the entire duration of a calendar based planning period, e.g., one month, and then averaged and analyzed according to indicators of economic performance, for example, profitability. Further, the uniform time segments that include the averaged data may be assembled together into a plan that may establish the desired inventory level of the analyzed product, in order to maintain targeted profitability. For the purposes of comparison, the inventory constraints and the planned inventory level are maintained the same in the example representing the conventional technique, as well as in the example of the novel methodology, described herein. However, the example of the schedule of the present disclosure outperforms the schedule of the conventional art in terms of following the planning instructions while maintaining the feasibility of implementation.

Namely, the real-world events of the schedule may affect the inventory as they occur, for example, daily or every few days, and may instantaneously increase or decrease the level of the product. As a result, the scheduling decisions may be non-linear, because they may be made in discrete time segments and in an environment of uncertainty. Consequently, the multiple-period model of the scheduling process may not allow the scheduler to maintain a constant inventory level of the product on a daily basis, and to exactly match the overly coarse and limited single-period model of the plan. Instead, the scheduler traditionally adjusts the inventory level of the product in a reactive fashion by observing the current level, the planned level and the quantity of the product available, in light of recent operational events at the facility. In order to assist the scheduler in responding adequately to the new operational circumstances, the planning may be performed by incorporating a strategy-based optimization, discussed in detail in International Application No. PCT/US/2013/045301 (published as WO/2013/188481), the entire contents of which are hereby incorporated by reference. In other words, a strategy may be developed in order to communicate intent behind the established plan.

A strategy based approach allows the scheduler to interpret the planning instructions in a more intelligible manner. Nevertheless, conventional technology provides a short-sighted decision support environment, where the scheduler uses judgments and applies strategies in a reactive manner with a higher emphasis on the current conditions relative to the future ability to meet planned goals with feasibility. In other words, traditionally, the scheduling tasks performed in view of the plan, or even in observance of the intent and the spirit of the plan, ignore or downplay the future constraints caused by the subsequent foreseeable events and the upcoming operational restrictions. While this may not cause operational infeasibilities, frequently it can lead to lost opportunity in terms of meeting planned profitability across the schedule. This lack of foresight will be further explained in reference to FIG. 2.

Turning to the top portion of FIG. 2, the scheduler may move along in the context of time and react to the operational events as they occur. An issue arises when, at a certain moment in time, the operational circumstances become such that in order for the scheduled inventory to be changed in line with the planning instructions, the available quantity of the product, upon being added to the current inventory level, exceeds the allowable upper limit. As a result, the schedule becomes infeasible. Accordingly, the scheduler has an option to either overflow the tank, for example, or to reschedule disposal of the excessive quantity of the product. The consequence of this scheduling example of the conventional technology is diminished efficiency, where the near-sightedness leads to unnecessary additional events, which could have been eliminated if foreseen in a timely manner.

One way of providing full look-ahead may be to develop a full scheduling model with all the details of the various events in the future and solve it using multi-period optimization methods. The formulation of this problem is normally hampered by the certainty with which events are known and the detail with which events and tasks in the outer periods of the horizon could be modeled. The solution of these formulations in order to obtain a schedule grows exponential in complexity as the size of the problem in terms of the number of decision variables or time periods grow larger. It is also difficult to interpret the results of these large schedule optimization problems when solved with all the details. The flexible time modeling approach may allow a user to fold the essential differentiators across time into the model and lump or aggregate other variables and parameters. In addition, the "look-ahead" approach may be coupled with strategies, discussed in detail in International Application No. PCT/US/2013/045301 (published as WO/2013/188481), the entire contents of which are hereby incorporated by reference. In addition, when possible, the "look-ahead" technique may be applied to solve the optimization problem to extract an optimal sequence of desirable goals that do not compromise the inventory or other operational feasibility.

An example of the "look-ahead" approach of the flexible time modeling, illustrated in the bottom portion of FIG. 2, systematically eliminates the described undesirable outcome of the conventional methods. Specifically, the scheduling of the flexible time modeling technique may be performed by defining several time segments in advance, which may be determined based on the upcoming operational events. In other words, this "look-ahead" approach may assess the future events based on their overall impact throughout the multiple time segments, and may coordinate several upcoming portions of the schedule in order to maintain a balance of the following two goals. The first goal may remain the scheduling feasibility that the conventional technology focuses on. The second goal of this example of the flexible time modeling may be to adjust the feasible segments of the schedule, linked together in an integral scheduling analysis, in order to bring them as close to the planned line of reference as possible, without violating their achievability. In essence, the flexible time modeling may recognize that a feasible schedule is an adjustable, maneuverable concept, where, among multiple schedulable options, an optimal one may be determined, in order to optimize the economic performance set out by the plan. The flexible time modeling may achieve this balance by extending the horizon along which the scheduler may observe the planned goals. This horizon may reach substantially beyond a single time segment defined by a single operational event and include multiple events or even cover the entire planning period. One example of the results of this improved approach is shown in the lower portion of FIG. 2, where the scheduling decisions may maintain the feasibility of the multi-period modeled schedule throughout the entire duration of the single-period modeled plan.

Further, this novel approach may allow for additional flexibility of reconfiguring the sequential time segments of the schedule, assembled ahead of time. For example, if the planned inventory level of the example of FIG. 2 remains the same, but a dominant real-world event that is unaccounted for in the computational model occurs, the schedule may be significantly affected by such an event. In other words, while this dominant event may become a prevailing factor for every other event within its sphere of influence, this new event may not yet have been incorporated in the mathematical model. An advantage of the flexible time modeling technique in this instance may be that the computational model may be reconfigured for the dominant event to be included into the analysis process. Moreover, the substantial impact of the dominant new event may be absorbed in a gradual and systematic manner, by distributing its effect across several time segments of the schedule. Therefore, the "look-ahead" aspect of the flexible time modeling may provide the scheduler with a flexibility to better manage the omitted event. As a result, the operational activities and events may be rearranged as many times as necessary before the schedule is actually implemented in order for the readjusted schedule to remain aligned with the planning goals.

Figure 3:
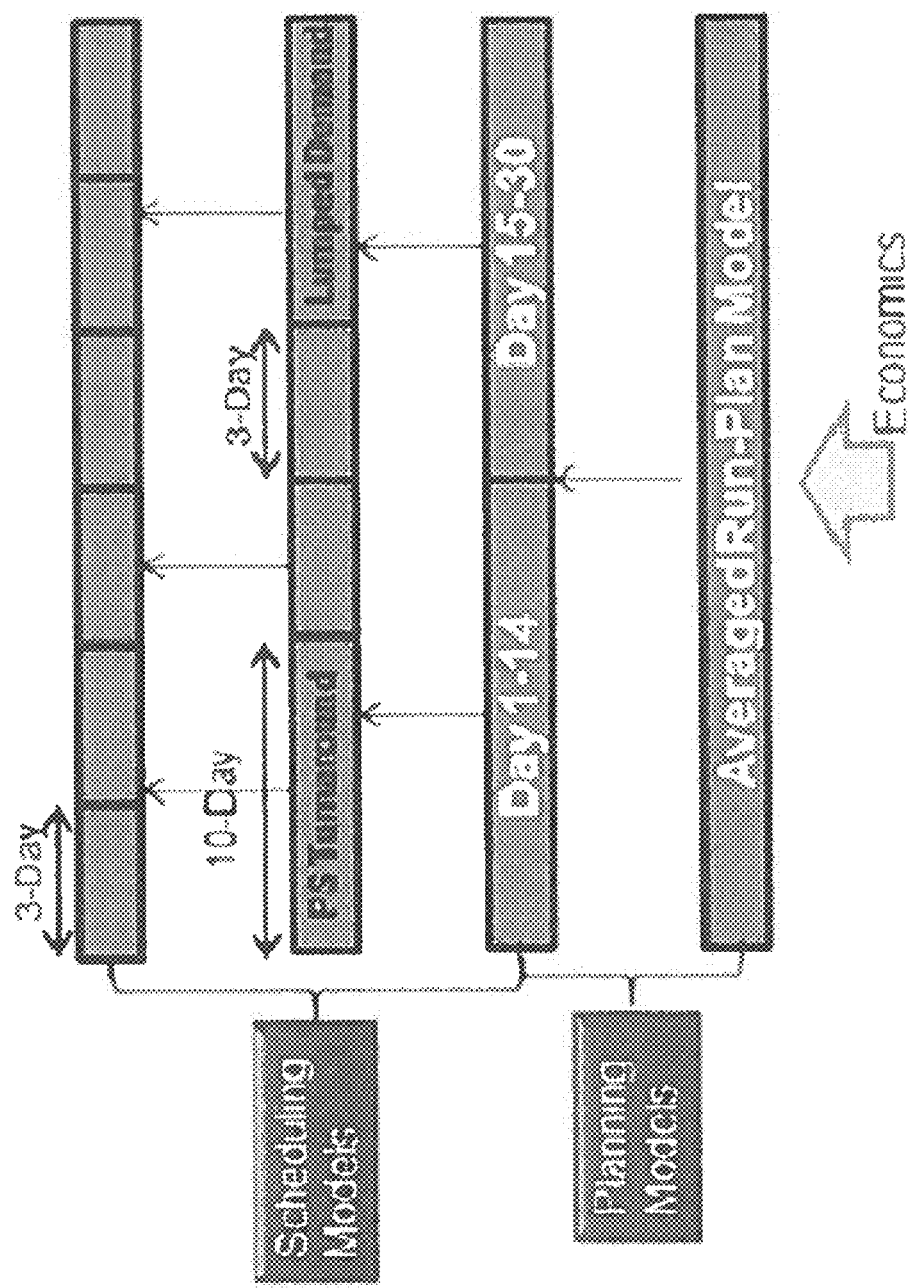
FIG. 3 shows an example of translating the single-period model of a plan into the multi-period model of a schedule of the present invention.

FIG. 3 illustrates one example of how the single-period modeled planning is filtered into the multi-period modeled schedule. The process of translating the planning targets into the execution of the schedule may begin with an averaged run-plan model, which may be a single-period model that may define desired economic performance. In this example, the economic objectives, e.g., revenue, cost, profitability, etc. may be first translated into measurable targets. Being that the economic targets of the plan may be dependent on a value of the manufactured product, in the context of the scheduling process the instructions may be expressed in terms of quality and quantity of the product. Therefore, the first step of the technique may be to start with the full multi-period scheduling model, which is analogical to dividing the single-period model into time segments. The scheduling model, in addition to multi-periodicity, may have operational models and constraints including but not limited to inventories (e.g., tankage) and other time integrating operations. This model may be sequentially aggregated by using the techniques described later to obtain the variables, parameters and constraints for an aggregated model. In the example presented in FIG. 3, a single-time period of one month may be fragmented into a first time period including days 1-14 and a second time period covering days 15-30. Once the time segmentation begins, the planning model analysis may be substituted with the scheduling multiple-time period model. Next, the scheduler may incorporate data originating from the operational events into the presorted time segments. Finally, the schedule may be formed in, for example, uniform three-day periods where the incorporated data may be disaggregated for the implementation of the schedule. In this example, the aggregation/disaggregation strategy shown is an average strategy, where the data organized in three-day segments may be averaged for the daily execution of the schedule. The process of the translation of the planning model into the scheduling model, as performed in the flexible time modeling approach, will be further elaborated in the example of FIG. 5.

Figure 4:
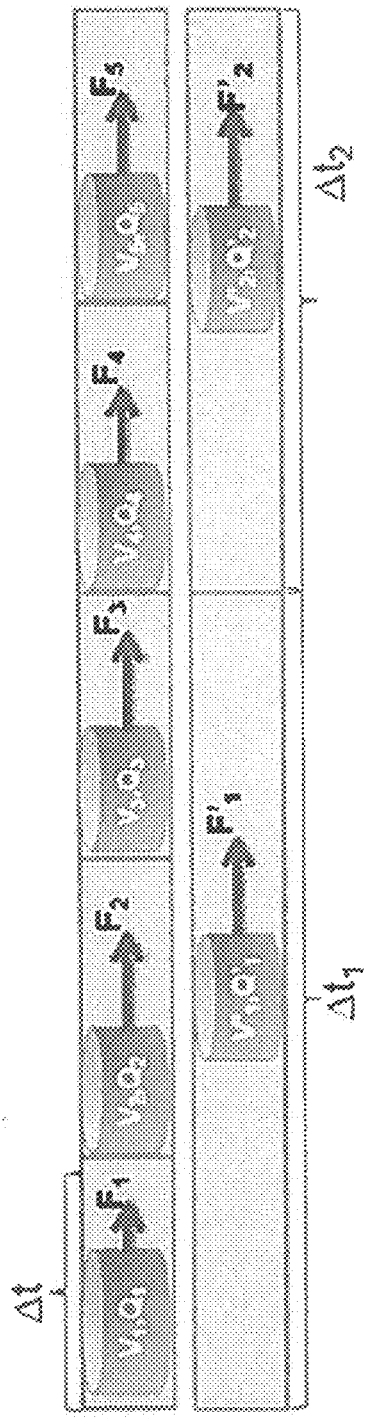
FIG. 4 shows an example of data aggregation and disaggregation.
Figure 4:
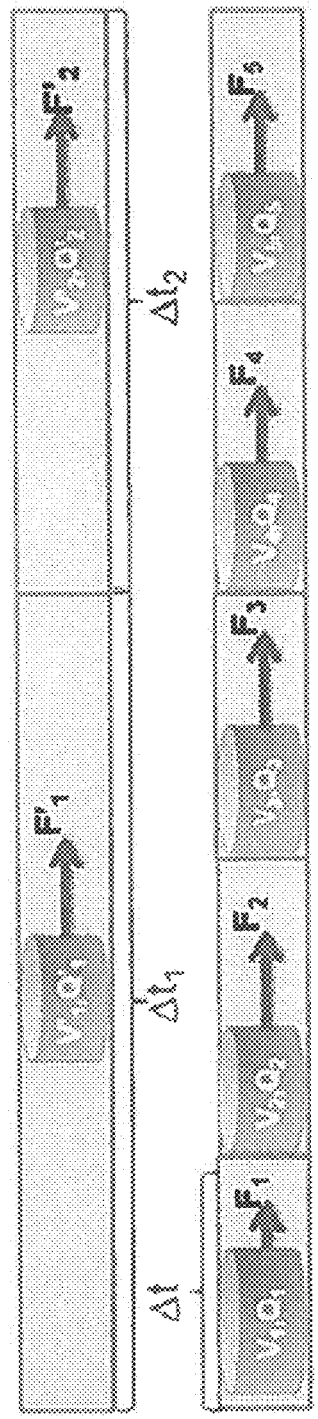

In addition to the average strategy, other aggregation/disaggregation strategies that can be applied in the flexible time modeling are a snapshot technique or a number of customized strategies, described in FIG. 4. The top portion of FIG. 4 is an illustration of data aggregation and the bottom portion represents the disaggregation process. In this example, the data pertaining to a product placed in a tank is divided in five time segments in order for the data to be aggregated subsequently. The variables involved in the analysis may be, for example, volume V, quality Q and flow F of the product stored in and emptied out of the tank. FIG. 4 shows an example of a non-uniform aggregation because the first three time segments are grouped into a time block of length $\Delta t_1$ and the last two time periods are added together to form a time block of length $\Delta t_2$. One of the aggregation strategies available with the flexible time modeling is the average strategy, shown in Equation (1):

$$V'_1 = (V_1 + V_2 + V_3) \Delta t / \Delta t_1 \text{ and } V'_2 = (V_4 + V_5) \Delta t / \Delta t_2 \quad (1)$$

The volume of the product during the first three time segments may be averaged across the time block of length $\Delta t_1$, and the volume of the product during the last two time segments may be averaged across the time block of length $\Delta t_2$.

Turning to an example of the snapshot aggregation strategy, this technique may entail selecting any of the time segments within a cumulative time block (i.e., $\Delta t_1$ or $\Delta t_2$) and determining the value of the variable of interest (e.g., flow F) within the observed time segment. Subsequently, the determined value within the observed time segment may be designated as the aggregated snapshot value uniformly valid for the entire time block, as indicated in Equation (2):

$$F'_1 = F_1 \text{ and } F'_2 = F_4 \quad (2)$$

Moreover, a customized aggregation strategy may be used if it is considered better applicable to a particular variable within the cumulative time block, for example, quality Q:

$$Q'_1 = (Q_1 + 2*Q_2 + Q_3)/4 \text{ and } Q'_2 = (Q_4 + Q_5)/2 \quad (3)$$

The three strategies described above may also be used for data disaggregation. However, during the disaggregation, the data may be processed "from one to many," i.e., the data of one time block may be distributed among its individual segments. Accordingly, the process of data disaggregation may be accompanied by a degree of approximation, since certain detailed information may be lost. As a result, in the course of the disaggregation, assumptions may need to be made regarding how operational events of the multiple time segments of a time block relate to each other.

The disaggregation techniques used in the flexible time modeling may be the average strategy, the snapshot strategy and various customized strategies. An example of the average strategy of disaggregation is as follows:

$$V_1 = V_2 = V_3 = V'_1 \text{ and } V_4 = V_5 = V'_2 \quad (4)$$

As shown in Equation (4), the data representing the cumulative time block may be adopted by the individual segments of the block.

Similarly, the snapshot strategy may disaggregate data by assigning the value uniformly valid throughout the time block to a time period of interest, as shown in Equation (5):

$$F_1 = F'_1 \text{ and } F_4 = F'_2 \quad (5)$$

In addition, a customized disaggregation strategy may be applied if it is considered best fitting for a particular variable within the cumulative time block:

$$Q_1 = 2*Q'_1/3; Q_2 = 4*Q'_1/3; Q_3 = 2*Q'_1/3 \text{ and } Q_4 = Q'_2/ Q_5 = Q'_2 \quad (6)$$

Any of the described aggregation/disaggregation strategies may be applied in the flexible time modeling technique in order to translate the planning objectives into a feasible schedule or to incorporate real world events into economic decisions of a plan.

Figure 5:
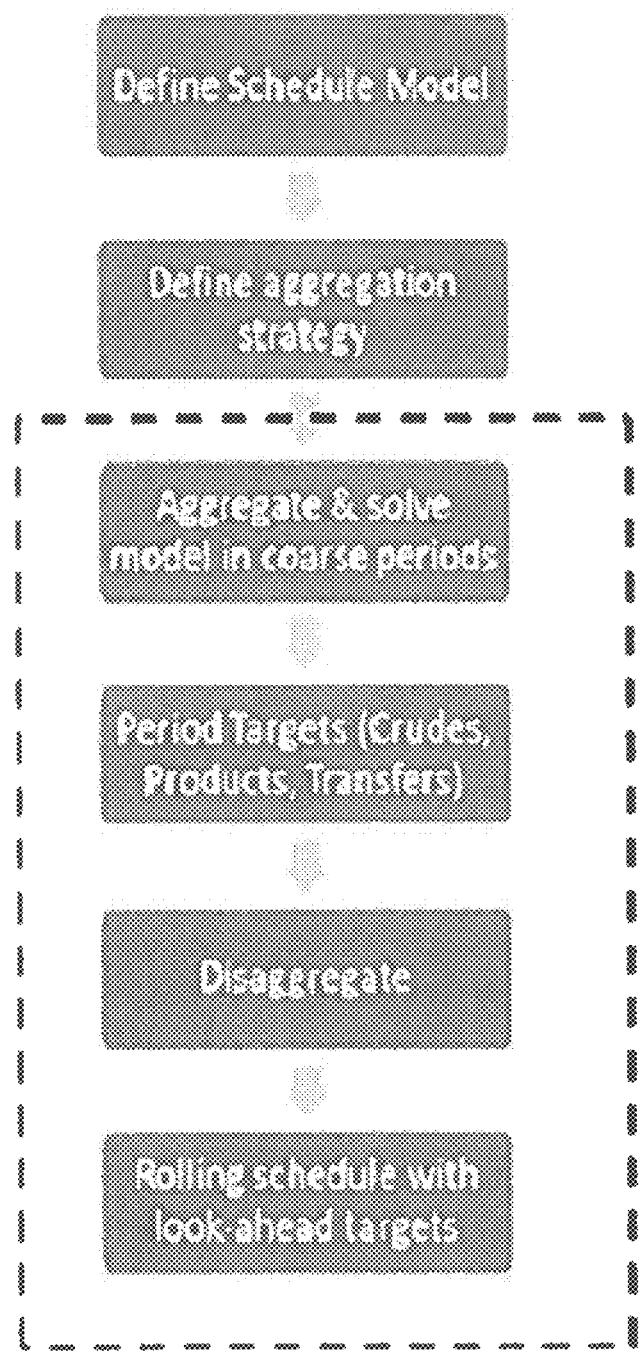
FIG. 5 shows a process behind the translating of the planning model into the scheduling model of the present invention.

FIG. 5 illustrates an example of the process behind the translation of the planning model into the scheduling model, as performed by the flexible time modeling technique. At the outset, the scheduling model may be defined, in order to formulate a scheduling layout for the data aggregation. For example, the scheduling model may be uniform, where the time periods of the schedule may be the same. In addition, the scheduling model may be non-uniform, where the nature of the operational activities may be better managed by scheduling time periods of different lengths. Further, the scheduler may create an event-based schedule, where the occurrence and the duration of the operational events determine the form of the schedule.

Upon defining the scheduling model, the next step of the flexible time modeling may be defining the most appropriate strategy for the data to be aggregated into a computational model that incorporates the economic targets of the planning process. Subsequently, the aggregated model may be solved in a context of coarse time periods, for example, two or three time periods, as described in FIG. 3. Once the aggregated model is solved, the next step may be to extract data from inventory and profitability concerns and apply the "look-ahead" approach in order to define a set of achievable targets. Some examples of the defined targets may be productions targets, consumption targets, transfers of the products between tanks, etc. Once the solved model provides a satisfactory set of answers for the corresponding set of targets, the data disaggregation may be performed. Finally, events at the level of the day to day operations may redefine a new set of targets, in which case optimization strategies may be applied in order to achieve the new targets consistent with the intent of the planning guidelines communicated by the strategies.

The "look-ahead" approach of the flexible time modeling significantly improves the coordination between the single-period model of the planning process and the multiple-period model of the schedule implementation. Analyzing several upcoming segments of the schedule simultaneously in view of the planned objectives allows the scheduler to remain in line with the planned targets while maintaining the feasibility of the schedule. Formulating the schedule for several time segments at a time provides additional flexibility of rescheduling upon new operational developments while gravitating towards the fulfillment of the planning goals. The transparency of the planning instructions introduced by the application of strategies further enables the scheduler to validate rolling schedule adjustments against the intent of the plan.

The presently disclosed subject matter may also be embodied as a computer-readable storage medium having executable instructions for performing the various processes as described herein. The storage medium may be any type of computer-readable medium (i.e., one capable of being read by a computer), including non-transitory storage mediums such as magnetic or optical tape or disks (e.g., hard disk or CD-ROM), solid state volatile or non-volatile memory, including random access memory (RAM), read-only memory (ROM), electronically programmable memory (EPROM or EEPROM), or flash memory. The term "non-transitory computer-readable storage medium" encompasses all computer-readable storage media, with the sole exception being a transitory, propagating signal. The coding for implementing the present invention may be written in any suitable programming language or modeling system software, such as AIMMS. Solvers that can be used to solve the equations used in the present invention include CPLEX, XPress, KNITRO, CONOPT, GUROBI, and XA, as well as other solvers form MINLP including global solvers such as BARON.

The presently disclosed subject matter may also be embodied as a computer system that is programmed to perform the various processes described herein. The computer system may include various components for performing these processes, including processors, memory, input devices, and/or displays. The computer system may be any suitable computing device, including general purpose computers, embedded computer systems, network devices, or mobile devices, such as handheld computers, laptop computers, notebook computers, tablet computers, mobile phones, and the like. The computer system may be a standalone computer or may operate in a networked environment.

Although the various systems, modules, functions, or components of the present invention may be described separately, in implementation, they do not necessarily exist as separate elements. The various functions and capabilities disclosed herein may be performed by separate units or be combined into a single unit. Further, the division of work between the functional units can vary. Furthermore, the functional distinctions that are described herein may be integrated in various ways.

Additional Embodiments

Embodiment 1

A method of operating a facility, comprising: (a) using a computer system that stores an application for determining a plan and a schedule for the operation of a facility; (b) acquiring data from operational activities of the facility; (c) aggregating the acquired data and defining a mathematical model for the aggregated data to be processed; (d) solving the mathematical model and obtaining results, wherein the obtained results determine the plan for the operation of the facility; (e) extracting operational data and combining the operational data with the results obtained by the mathematical model in order to apply flexible time modeling, wherein the flexible time modeling includes: (1) defining a set of targets achievable by the schedule, and (2) analyzing a portion of the schedule covering a plurality of upcoming operational events of the facility in order for the analyzed portion of the schedule as a whole to remain consistent with the results obtained by the mathematical model and with the defined set of achievable targets; (f) disaggregating data that pertains to the analyzed portion of the schedule and determining the schedule according to the disaggregated data; and (g) applying the application to operate the facility according to the determined plan and the determined schedule.

Embodiment 2

The method of Embodiment 1 wherein the mathematical model is solved as a multi-period model that processes data of a plurality of time periods.

Embodiment 3

The method according to anyone of the preceding Embodiments, wherein the portion of the schedule includes an entire operational time period analyzed by the plan.

Embodiment 4

The method according to anyone of the preceding Embodiments, wherein the flexible time modeling is reapplied upon occurrence of a subsequent operational event that is not accounted for in the mathematical model, and that occurs prior to implementation of the schedule.

Embodiment 5

The method according to anyone of the preceding Embodiments, wherein the mathematical model includes a strategy-based optimization.

Embodiment 6

The method according to anyone of the preceding Embodiments, wherein data aggregation is performed by an average aggregation technique, a snapshot aggregation technique or a customized aggregation technique.

Embodiment 7

The method according to anyone of the preceding Embodiments, wherein data disaggregation is performed by an average disaggregation technique, a snapshot disaggregation technique or a customized disaggregation technique.

Embodiment 8

A computer system for determining the operation of a facility, the computer system being programmed to perform steps that comprise: (a) using a computer system that stores an application for determining a plan and a schedule for the operation of a facility; (b) acquiring data from operational activities of the facility; (c) aggregating the acquired data and defining a mathematical model for the aggregated data to be processed; (d) solving the mathematical model and obtaining results, wherein the obtained results determine the plan for the operation of the facility; (e) extracting operational data and combining the operational data with the results obtained by the mathematical model in order to apply flexible time modeling, wherein the flexible time modeling includes: (1) defining a set of targets achievable by the schedule, and (2) analyzing a portion of the schedule covering a plurality of upcoming operational events of the facility in order for the analyzed portion of the schedule as a whole to remain consistent with the results obtained by the mathematical model and with the defined set of achievable targets; and (f) disaggregating data that pertains to the analyzed portion of the schedule and determining the schedule according to the disaggregated data.

Embodiment 9

The computer system of Embodiment 8, wherein the mathematical model is solved as a multi-period model that processes data of a plurality of time periods.

Embodiment 10

The computer system of Embodiment 8 or 9, wherein the portion of the schedule includes an entire operational time period analyzed by the plan.

Embodiment 11

The computer system according to any one of Embodiments 8-10, wherein the flexible time modeling is reapplied upon occurrence of a subsequent operational event that is not accounted for in the mathematical model, and that occurs prior to implementation of the schedule.

Embodiment 12

The computer system according to any one of Embodiments 8-11, wherein the mathematical model includes a strategy-based optimization.

Embodiment 13

The computer system according to any one of Embodiments 8-12, wherein data aggregation is performed by an average aggregation technique, a snapshot aggregation technique or a customized aggregation technique.

Embodiment 14

The computer system according to any one of Embodiments 8-13, wherein data disaggregation is performed by an average disaggregation technique, a snapshot disaggregation technique or a customized disaggregation technique.

Embodiment 15

A non-transitory machine-readable storage medium comprising instructions which, when executed by a processor, cause the processor to: (a) use a computer system that stores an application for determining a plan and a schedule for the operation of a facility; (b) acquire data from operational activities of the facility; (c) aggregate the acquired data and defining a mathematical model for the aggregated data to be processed; (d) solve the mathematical model and obtaining results, wherein the obtained results determine the plan for the operation of the facility; (e) extract operational data and combining the operational data with the results obtained by the mathematical model in order to apply flexible time modeling, wherein the flexible time modeling includes: (1) defining a set of targets achievable by the schedule, and (2) analyzing a portion of the schedule covering a plurality of upcoming operational events of the facility in order for the analyzed portion of the schedule as a whole to remain consistent with the results obtained by the mathematical model and with the defined set of achievable targets; and (f) disaggregate data that pertains to the analyzed portion of the schedule and determine the schedule according to the disaggregated data.

Embodiment 16

The non-transitory machine-readable storage medium of Embodiment 15, wherein the mathematical model is solved as a multi-period model that processes data of a plurality of time periods.

Embodiment 17

The non-transitory machine-readable storage medium of Embodiments 15 or 16, wherein the portion of the schedule includes an entire operational time period analyzed by the plan.

Embodiment 18

The non-transitory machine-readable storage medium according to any one of Embodiments 15-17, wherein the flexible time modeling is reapplied upon occurrence of a subsequent operational event that is not accounted for in the mathematical model, and that occurs prior to implementation of the schedule.

Embodiment 19

The non-transitory machine-readable storage medium according to any one of Embodiments 15-18, wherein the mathematical model includes a strategy-based optimization.

Embodiment 20

The non-transitory machine-readable storage medium according to any one of Embodiments 15-19, wherein data aggregation/disaggregation is performed by an average aggregation technique, a snapshot aggregation technique or a customized aggregation technique.

The foregoing description and examples have been set forth merely to illustrate the invention and are not intended to be limiting. Each of the disclosed aspects and embodiments of the present invention may be considered individually or in combination with other aspects, embodiments, and variations of the invention. Modifications of the disclosed embodiments incorporating the spirit and substance of the invention may occur to persons skilled in the art and such modifications are within the scope of the present invention.

We claim:

1. A method of operating a facility, comprising:
   (a) using a computer system that stores an application for determining a plan for the operation of the facility and a schedule for the operation of the facility in accordance with the plan;
   (b) acquiring data from operational activities of the facility;
   (c) aggregating the acquired data and defining a mathematical model for the aggregated data to be processed;
   (d) solving the mathematical model and obtaining results, wherein the obtained results determine the plan for the operation of the facility;
   (e) extracting operational data and combining the operational data with the obtained results from the mathematical model in order to apply flexible time modeling to develop feasible schedule consistent with the plan, wherein the flexible time modeling includes:
      (1) defining a set of targets achievable by the schedule,
      (2) defining a plurality of time segments in the schedule based upon a plurality of upcoming operational events of the facility,
      (3) analyzing a portion of the schedule containing the plurality of time segments covering the plurality of upcoming operational events of the facility in order for the analyzed portion of the schedule as a whole to remain consistent with the plan obtained from the results obtained by the mathematical model and with the defined set of achievable targets, wherein analyzing a portion of the schedule includes eliminating infeasible scheduling segments associated with the plurality of time segments, and determining optimal feasible scheduling segments;
   (f) disaggregating data that pertains to the analyzed portion of the schedule and determining an updated schedule according to the disaggregated data;
   (g) reapplying the flexible time modeling in step (e) and reperforming the disaggregating of data that pertains to the analyzed portion of the schedule and determining the schedule in step (f) upon occurrence of a subsequent operational event that is not accounted for in the mathematical model, and that occurs prior to implementation of the determined updated schedule;
   (h) applying the application to operate the facility according to the determined plan and the updated determined schedule.

2. The method of claim 1, wherein the mathematical model is solved as a multi-period model that processes data of a plurality of time periods.

3. The method of claim 1, wherein the portion of the schedule includes an entire operational time period analyzed by the plan.

4. The method of claim 1, wherein the mathematical model includes a strategy-based optimization.

5. The method of claim 1, wherein data aggregation is performed by an average aggregation technique, a snapshot aggregation technique or a customized aggregation technique.

6. The method of claim 1, wherein data disaggregation is performed by an average disaggregation technique, a snapshot disaggregation technique or a customized disaggregation technique.

7. A computer system for determining the operation of a facility, the computer system being programmed to perform steps that comprise:
   (a) using a computer system that stores an application for determining a plan for the operation of the facility and a schedule for the operation of the facility in accordance with the plan;
   (b) acquiring data from operational activities of the facility;
   (c) aggregating the acquired data and defining a mathematical model for the aggregated data to be processed;
   (d) solving the mathematical model and obtaining results, wherein the obtained results determine the plan for the operation of the facility;
   (e) extracting operational data and combining the operational data with the obtained results from the mathematical model in order to apply flexible time modeling to develop feasible schedule consistent with the plan, wherein the flexible time modeling includes:
      (1) defining a set of targets achievable by the schedule,
      (2) defining a plurality of time segments in the schedule based upon a plurality of upcoming operations events of the facility,
      (3) analyzing a portion of the schedule containing the plurality of time segments covering the plurality of upcoming operational events of the facility in order for the analyzed portion of the schedule as a whole to remain consistent with the plan obtained from the results obtained by the mathematical model and with the defined set of achievable targets, wherein analyzing a portion of the schedule includes eliminating infeasible scheduling segments associated with the plurality of time segments, and determining optimal feasible scheduling segments;
   (f) disaggregating data that pertains to the analyzed portion of the schedule and determining an updated schedule according to the disaggregated data; and
   (g) reapplying the flexible time modeling in step (e) and reperforming the disaggregating of data that pertains to the analyzed portion of the schedule and determining the schedule in step (f) upon occurrence of a subsequent operational event that is not accounted for in the mathematical model, and that occurs prior to implementation of the determined updated schedule.

8. The computer system of claim 7, wherein the mathematical model is solved as a multi-period model that processes data of a plurality of time periods.

9. The computer system of claim 7, wherein the portion of the schedule includes an entire operational time period analyzed by the plan.

10. The computer system of claim 7, wherein the mathematical model includes a strategy-based optimization.

11. The computer system of claim 7, wherein data aggregation is performed by an average aggregation technique, a snapshot aggregation technique or a customized aggregation technique.

12. The computer system of claim 7, wherein data disaggregation is performed by an average disaggregation technique, a snapshot disaggregation technique or a customized disaggregation technique.

13. A non-transitory machine-readable storage medium comprising instructions which, when executed by a processor, cause the processor to:

(a) use a computer system that stores an application for determining a plan for the operation of the facility and a schedule for the operation of the facility in accordance with the plan;
(b) acquire data from operational activities of the facility;
(c) aggregate the acquired data and defining a mathematical model for the aggregated data to be processed;
(d) solve the mathematical model and obtaining results, wherein the obtained results determine the plan for the operation of the facility;
(e) extract operational data and combining the operational data with the obtained results from the mathematical model in order to apply flexible time modeling to develop feasible schedule consistent with the plan, wherein the flexible time modeling includes:
 (1) defining a set of targets achievable by the schedule,
 (2) defining a plurality of time segments in the schedule based upon a plurality of upcoming operations events of the facility,
 (3) analyzing a portion of the schedule containing the plurality of time segments covering the plurality of upcoming operational events of the facility in order for the analyzed portion of the schedule as a whole to remain consistent with the plan obtained from the results obtained by the mathematical model and with the defined set of achievable targets, wherein analyzing a portion of the schedule includes eliminating infeasible scheduling segments associated with the plurality of time segments, and determining optimal feasible scheduling segments;
(f) disaggregating data that pertains to the analyzed portion of the schedule and determining an updated schedule according to the disaggregated data; and
(g) reapplying the flexible time modeling in step (e) and reperforming the disaggregating of data that pertains to the analyzed portion of the schedule and determining the schedule in step (f) upon occurrence of a subsequent operational event that is not accounted for in the mathematical model, and that occurs prior to implementation of the determined updated schedule.

14. The non-transitory machine-readable storage medium of claim 13, wherein the mathematical model is solved as a multi-period model that processes data of a plurality of time periods.

15. The non-transitory machine-readable storage medium of claim 13, wherein the portion of the schedule includes an entire operational time period analyzed by the plan.

16. The non-transitory machine-readable storage medium of claim 13, wherein the mathematical model includes a strategy-based optimization.

17. The non-transitory machine-readable storage medium of claim 13, wherein data aggregation/disaggregation is performed by an average aggregation technique, a snapshot aggregation technique or a customized aggregation technique.

* * * * *